(12) United States Patent
Buynoski

(10) Patent No.: US 6,248,658 B1
(45) Date of Patent: Jun. 19, 2001

(54) METHOD OF FORMING SUBMICRON-DIMENSIONED METAL PATTERNS

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/229,264

(22) Filed: Jan. 13, 1999

(51) Int. Cl.$^7$ .................. H01L 21/4763; C23C 16/48; B05D 5/12
(52) U.S. Cl. .................. 438/622; 438/681; 427/581; 427/584; 427/126.4; 427/126.5; 427/126.6; 250/492.22
(58) Field of Search .................. 438/681, 622; 427/581, 582, 584, 126.1–126.6; 250/492.22

(56) References Cited

U.S. PATENT DOCUMENTS

| | | | |
|---|---|---|---|
| 4,340,617 | 7/1982 | Deutsch et al. | 427/53.1 |
| 4,451,503 | 5/1984 | Blum et al. | 427/53.1 |
| 4,701,347 | 10/1987 | Higashi | 437/246 |
| 4,874,634 | * 10/1989 | Easton et al. | 427/54.1 |
| 5,130,172 | * 7/1992 | Hicks et al. | 427/252 |
| 5,424,252 | * 6/1995 | Morishita | 437/230 |
| 5,534,312 | * 7/1996 | Hill et al. | 427/533 |
| 5,750,212 | * 5/1998 | Kickelhain | 427/581 |

OTHER PUBLICATIONS

Kantor et al. "Metal pattern deposition by laser–induced forward transfer" in Proceedings of Symposium B on Photo–Assisted Processing of Surfaces and Thin Films, Elsevier: Amsterdam, p. 196, May 1994.*
Geretovszky et al. "Can laser deposition from the liquid phase be made competitive?" in Applied Surface Science 109/110, pp. 467–472, Jun. 1997.*
Merriam–Webster's Collegiate Dictionary, 10th ed., Merriam–Webster: United States, p. 226, 1998.*
The Cassell Dictionary of Physics, Cassell: United Kingdom, p. 96, 1998.*
Van Zant, Microchip Fabrication, 3rd ed., McGraw–Hill: New York, pp. 203–205, 226–242, 1997.*
Campbell, The Science and Engineering of Microelectronic Fabrication, Oxford University Press: New York, pp. 151–178, 1996.*
Wolf, Silicon Processing for the VLSI Era, vol. 2: Process Integration, Lattice Press: Sunset Beach, pp. 176, 180–182, 222–223, 281–286, 1990.*
Julius Grant, ed. Hackh's Chemical Dictionary, 4th Ed., New York: McGraw–Hill, pp. 272–273, 1969.*
S. Wolf, Silicon Processing for the VLSI Era, vol. 2: Process Integration, Lattice Press: Sunset Beach, CA, pp. 176, 180–181, 222–223, and 281–286, 1990.*
ASM Handbook, vol. 5, Surface Engineering, ASM International: Materials Park, OH, pp. 311–313, 1994.*

\* cited by examiner

Primary Examiner—Charles Bowers
Assistant Examiner—Erik J Kielin

(57) ABSTRACT

Submicron-dimensioned metallization patterns are formed on a substrate surface by a photolytic process wherein portions of a metal-compound containing fluid layer on the substrate surface which are exposed through a pattern of submicron-sized openings in an overlying exposure mask are irradiated with UV to near X-ray radiation. Photodecomposition of the metal-containing compound results in selective metal deposition on the substrate surface according to the exposure mask pattern. When liquid, the fluid layer is prevented from contacting the mask surfaces during photolysis in order to prevent closing off of the very small apertures by deposition thereon. The inventive method is of particular utility in forming multi-level, in-laid, "back-end" metallization of high density integrated circuit semiconductor devices.

16 Claims, 3 Drawing Sheets

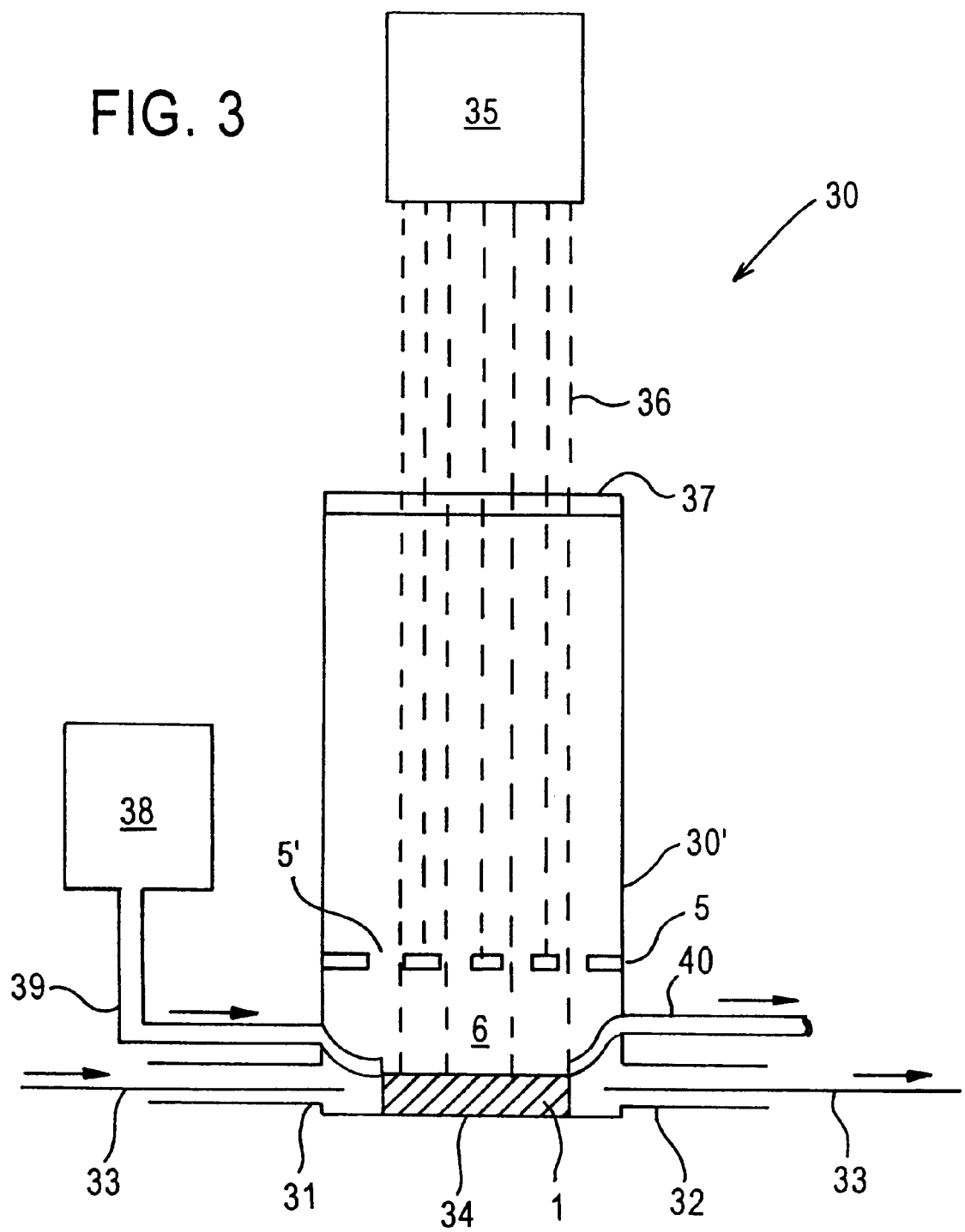

METHOD OF FORMING SUBMICRON-DIMENSIONED METAL PATTERNS

FIELD OF THE INVENTION

The present invention relates to a method of forming patterned metal layers on a surface of a substrate, the pattern comprising a plurality of spaced-apart, submicron-dimensioned features. More particularly, the present invention relates to a simplified method of manufacturing high-density, multi-metallization layer integrated circuit devices at lower cost and with reliable interconnection patterns. The present invention enjoys particular industrial applicability in manufacturing high-density, multi-metallization integrated circuit semiconductor devices with design features of 0.18 $\mu$m and under, e.g., 0.13 $\mu$m and under.

BACKGROUND OF THE INVENTION

The present invention relates to a method of forming patterned metal films wherein the pattern includes submicron-dimensioned features and is practically useful in integrated circuit semiconductor device manufacture. The present invention especially adapted for use in "back-end" processing for forming in-laid metallization patterns.

The escalating requirements for high density and performance associated with ultra large-scale integration (ULSI) semiconductor device wiring are difficult to satisfy in terms of providing submicron-dimensioned (e.g., below 0.18 $\mu$m), low RC time constant metallization patterns, particularly wherein the submicron-sized metallization features such as vias, contact areas, grooves, trenches, etc., have high aspect (i.e., depth-to-width) ratios due to microminiaturization.

The present invention is applicable to various types of semiconductor devices, such as the type illustrated in FIG. 1 comprising a semiconductor substrate, usually of doped monocrystalline silicon (Si), having at least one active device region or component (e.g., an MOS type transistor, a diode, etc.) formed therein or thereon, and a plurality of sequentially formed inter-layer dielectrics (ILDs) and patterned conductive layers (METAL) formed therein and/or therebetween. An integrated circuit is formed therefrom containing a plurality of patterns of conductive lines separated by interwiring spacings, and a plurality of interconnection lines, such as bus lines, bit lines, word lines, and logic interconnect lines. Typically, the conductive patterns of substantially vertically spaced apart metallization layers are electrically interconnected by a substantially vertically oriented conductive plug (VIA) filling a via hole formed in the ILD separating the metallization layers, while another conductive plug filling a contact area hole establishes electrical contact with an active region (e.g., a source/drain region of an MOS type transistor) formed in or on the semiconductor wafer substrate. Conductive lines formed in groove or trench-like openings in overlying dielectric layers extend substantially parallel to the semiconductor substrate. Semiconductor devices of such type as illustrated in FIG. 1 and fabricated according to current technology may comprise five or more levels of such metallization in order to satisfy device geometry and miniaturization requirements.

Electrically conductive films or layers of the type used in "back-end" semiconductor manufacturing technology as required for fabrication of devices such as above described and illustrated in FIG. 1 typically comprise a metal such as titanium, tantalum, tungsten, molybdenum, aluminum, chromium, nickel, cobalt, palladium, silver, gold, copper, and their alloys. However, conventional methodology for performing "back-end" metallization processing utilizing any of the enumerated metals presents several disadvantages and drawbacks. Specifically, such conventional "back-end" processing is complex, difficult, costly, time consuming, and incurs a significant reduction in interconnection reliability and product yield as feature sizes decrease and the number of metallization levels increases. For example, a typical damascene-type process performed according to the conventional art for forming a single via/metallization pair can involve over 40 separate processing steps, including, inter alia, formation of a photoresist layer on a first dielectric layer; selective exposure of the photoresist through a mask; development of the photoresist; selective etching of the resist-coated dielectric layer to form a via hole pattern therein; filling of the via holes with metal, deposition and planarization of a second dielectric interlayer; photoresist formation thereon; pattern-selective exposure and development to form a pattern of openings therein corresponding to the desired metallization pattern; etching of the second dielectric layer to form a recess pattern therein corresponding to the desired metallization pattern; filling of the recesses with the selected metal, including formation of a blanket or overburden layer of excess thickness to ensure complete filling of the recesses; removal of the blanket or overburden layer; and planarization of the dielectric layer surface having the in-laid metallization pattern. Inasmuch as formation of each additional layer pair of vias/patterned metallization adds an additional approximately 40 process steps, it is evident that repetition of the above-described sequence of processing steps up to, e.g., 15 times, for forming high integration density, multi-metallization level semiconductor devices, entails significant cost, increased likelihood of occurrence of reliability problems, and reduced product yield. Furthermore, non-damascene type processes for forming in-laid metallization patterns, e.g., comprising blanket deposition of metal layers followed by selective removal thereof to define desired metallization patterns therein, dielectric gap-filling, and planarization are equally difficult, complex, expensive, and result in reduced reliability and product yield.

Thus, there exists a clear need for an efficient, simplified method for forming in-laid, "back-end" metallization patterns at low cost and with increased reliability and product yield. Specifically, there exists a need for an improved method for forming such metallization patterns in submicron-sized dimensions, for forming contacts, vias, and interconnect routings, which method is fully compatible with conventional process flow and methodology in the manufacture of ultra large-scale integration semiconductor devices.

The present invention fully addresses and solves the above described problems and drawbacks attendant upon conventional processes for manufacturing integrated circuit semiconductor devices requiring multiple metallization levels, particularly in providing a dramatic, very significant reduction in the number of requisite processing steps (i.e., from about 40 to about 6 for each via/metallization pair), thereby significantly reducing manufacturing costs, increasing product reliability and yield, and significantly increasing production throughput.

SUMMARY OF THE INVENTION

An advantage of the present invention is an efficient, simplified method for forming a patterned metal layer on a substrate, wherein the pattern includes a plurality of spaced-apart, submicron-dimensioned features.

Another advantage of the present invention is an efficient, simplified method for forming multiple levels of patterned metallization.

Still another advantage of the present invention is a method of manufacturing a device with an in-laid metallization pattern at lower cost and with higher manufacturing throughput and increased product yield than obtainable with conventional process methodology.

Yet another advantage of the present invention is an efficient, simplified method of manufacturing an integrated circuit semiconductor device utilizing in-laid "back-end" contacts and interconnections, at reduced manufacturing cost and with improved product quality, reliability, and reduced defects.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are achieved in part by a method of forming a patterned metal layer on a surface of a substrate, the metal pattern including a plurality of spaced-apart, submicron-dimensioned features, which method comprises the sequential steps of:

(a) providing a substrate having a surface for receiving the metal pattern thereon:

(b) positioning a patterned exposure mask at a predetermined distance above the surface of the substrate, the mask comprising a predetermined pattern of submicron-dimensioned openings formed therethrough for defining the metal pattern;

(c) supplying a fluid to the space between the mask and the substrate surface for establishing a layer of the fluid over and in contact with the substrate surface, the fluid comprising a compound containing at least one atom of the metal;

(d) selectively irradiating the portions of the fluid layer exposed through the pattern of mask openings with collimated radiation of wavelengths in the ultraviolet (UV) to the near X-ray portions of the electromagnetic spectrum to thereby photo-decompose the metal-containing compound and selectively deposit the patterned metal layer at locations corresponding to the predetermined mask pattern; and (e) continuing the irradiating for an interval sufficient to form the patterned metal layer to a predetermined thickness.

In embodiments according to the present invention, the fluid layer comprises a liquid solution of the metal-containing compound in a solvent or a gas comprising the metal-containing compound and an inert carrier gas; the fluid layer is continuously or pulse irradiated, with replenishment of the fluid layer with fresh fluid during intervals between pulses, e.g., between consecutive pulses; the metal-containing compound is a metal halide, an organometallic compound, or a metal chelate; and the metal is selected from the group consisting of titanium, tantalum, tungsten, molybdenum, aluminum, chromium, nickel, cobalt, palladium, silver, gold, and copper.

In preferred embodiments of the present invention, the metal is copper; the copper-containing compound is selected from alkyls, alkyl hydrides, alkoxides, alkanoates, carbonyls, halides, azides, nitrites, and chelates of copper; step (a) comprises providing a semiconductor wafer having a surface, the wafer including at least one active device region or component formed in, on, or below the wafer surface, a layer of a dielectric material formed over the wafer surface and having a surface including an in-laid metal pattern, the inlaid metal pattern comprising a plurality of spaced-apart, submicron-dimensioned features; and step (b) comprises positioning the patterned exposure mask in a predetermined vertically registered relation with the in-laid metal pattern, whereby predetermined portions of the features of the patterned metal layer are selectively formed in overlying contact with predetermined portions of the features of the in-laid metal layer.

In further preferred embodiments according to the present invention, the method of the present invention further comprises the sequential steps of: (f) depositing a layer of a dielectric material filling the gaps or spaces between adjacent features of the patterned metal layer, the dielectric material layer being blanket-deposited in an excess thickness over the patterned metal layer; (g) removing the excess thickness of the dielectric material layer and planarizing the surface thereof to form an in-laid metal pattern; and repeating steps (b)–(g) n times, where n is an integer from 1 to 15.

According to another aspect of the present invention, a method of manufacturing a semiconductor device comprises the sequential steps of:

(a) providing a substrate comprising a semiconductor wafer, the wafer including a surface having a dielectric layer formed thereover, the surface of the dielectric layer comprising a patterned plurality of in-laid, spaced-apart, submicron-dimensioned metal features forming electrical contacts, vias, interlevel metallization, and/or interconnect routing of at least one active device region or component of said semiconductor substrate;

(b) positioning a patterned exposure mask at a predetermined distance above the surface of the substrate, the mask comprising a predetermined pattern of submicron-dimensioned openings formed therethrough, the mask being positioned in a predetermined vertically registered relation with the in-laid metal pattern;

(c) supplying a fluid limited to the space between the mask and the substrate surface for establishing a layer of the fluid over and in contact with the substrate surface, the fluid comprising a compound containing at least one atom of the metal;

(d) selectively irradiating the portions of the fluid layer exposed through the pattern of mask openings with collimated radiation of wavelengths in the ultraviolet (UV) to the near X-ray portions of the electromagnetic spectrum to thereby photo-decompose the metal-containing compound and selectively deposit a patterned layer of the metal at locations corresponding to the predetermined mask pattern, whereby predetermined portions of the patterned metal layer are formed in overlying contact with predetermined portions of the features of the in-laid metal layer; and (e) continuing the irradiating for an interval sufficient to form the patterned metal layer to a predetermined thickness.

In embodiments according to the present invention, the method further comprises the sequential steps of: (f) depositing a layer of a dielectric material filling the gaps or spaces between adjacent features of the patterned metal layer, the dielectric material layer being blanket-deposited at an excess thickness over the patterned metal layer; (g) removing the excess thickness of the dielectric material layer and planarizing the surface thereof to form an in-laid metal pattern; and repeating steps (b)–(g) n times, where n is an integer from 1 to 15.

In embodiments according to the present invention, the semiconductor wafer comprises silicon; the metal-containing compound is a metal halide, azide, or nitrite, an organometallic compound, or a metal chelate; and the metal of the metal-containing compound is selected from the group consisting of titanium, tantalum, tungsten, molybdenum, aluminum, chromium, nickel, cobalt, palladium, silver, gold, and copper, preferably copper.

According to still another aspect of the present invention, silicon semiconductor integrated circuit devices comprising in-laid, "back-end" metallization patterns formed by the inventive method are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described and become apparent, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the present invention can best be understood when read in conjunction with the following drawings, wherein:

FIG. 3 illustrates, in simplified cross-sectional form, an apparatus for performing patterned metal layer deposition according to an embodiment of the present invention.

DESCRIPTION OF THE INVENTION

The present invention addresses and solves problems arising from manufacturing integrated circuit semiconductor devices, wherein, as part of the fabrication methodology, a plurality of patterned metallization layers separated by dielectric layers, are formed during "back-end" processing for providing contacts, interconnections, routing patterns, etc. to at least one active device region or component of a semiconductor wafer substrate. More specifically, the present invention advantageously provides a significant and dramatic reduction in the number of individual process steps required for the formation of multi-level metallization patterns compared to conventional processing, thereby increasing reliability while reducing manufacturing costs and product yield problems associated with conventional technology. In addition, the inventive method is fully compatible with other aspects of existing processing methodology and provides increased manufacturing throughput vis-à-vis conventional damascene-type electroplating and CMP processing.

According to embodiments of the present invention, a patterned metal layer comprising a plurality of submicron-dimensioned, spaced-apart features is formed on the surface of a substrate by selectively irradiating a layer of photo-decomposable compound of the metal present on the substrate surface through an exposure mask. Metal from the photo-decomposable compound is precipitated or otherwise selectively deposited in a pattern which substantially replicates the pattern of openings in the exposure mask. When the substrate surface intended to receive the metal pattern comprises an in-laid metal pattern of metal features separated by gaps filled with a dielectric material, the inventive process may be employed for the formation of selectively interconnected and patterned multi-level metallization patterns without requiring separate steps for via hole and plug formation. In addition, the inventive methodology advantageously eliminates numerous steps for photolitlhographic masking, etching, etc. In an embodiment of the present invention, formation of a level of metallization requires only three (3) steps. As a consequence of the inventive methodology, the number of process steps for forming, e.g., two (2) vertically spaced apart, selectively interconnected layers of patterned metal conductors, is dramatically and advantageously reduced from approximately forty (40) steps as with conventional methodology, to six (6) steps.

Figure 2A:
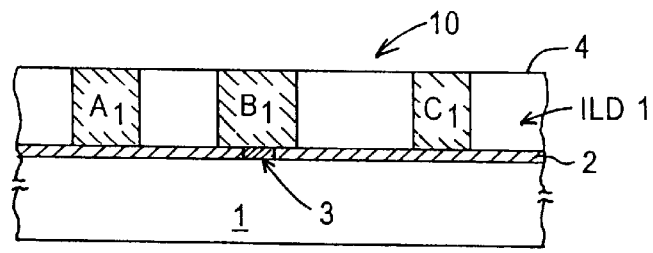
FIGS. 2(A)–2(D) illustrate, in simplified, cross-sectional form, a sequence of steps for forming one level of in-laid, patterned "back-end" metal contact/interconnection structure according to an embodiment of the present invention.

Referring now to FIGS. 2(A)–2(D), a sequence of steps for performing an illustrative, but non-limitative, embodiment of the present invention is shown therein. As shown in FIG. 2(A), in a first step, a substrate 10 comprising a semiconductor wafer 1, e.g., doped monocrystalline silicon, (Si), is provided, which wafer substrate may, for example, contain transistors, diodes, and other semiconductor elements (not shown) as are well known in the art. Semiconductor wafer 1 may also contain metal interconnect layers, not shown for illustrative simplicity. Insulator layer 2, e.g., of silicon dioxide, is formed on the surface of the semiconductor wafer 1 to electrically isolate the device structures and features of semiconductor wafer 1 from overlying interconnect lines $A_1$, $B_1$, and $C_1$, shown, for illustrative purposes, as having different widths. Also shown for illustrative purposes only, is contact 3 extending through insulator layer 2 for connecting interconnect line $B_1$ to semiconductor wafer body 1. The spaced-apart interconnect lines $A_1$, $B1$, and $C_1$ are typically made of electrically conductive material such as metal (e.g., aluminum, titanium, tungsten, tantalum, copper, etc.) and typically have widths less than about 0.40 μm, e.g., about 0.27 μm (at present), depths of from about 4,000 to about 10,000 Å, and inter-line spacings of from about 0.18 to about 0.27 μm (at present). Interlayer dielectric layer ILD-1 comprises a low dielectric constant material and isolates interconnect lines $A_1$, $B_1$, and $C_1$ from each other and may comprise any of the low dielectric materials (i.e., <3.9) conventionally employed for such purpose, e.g., organic polymers such as polytetrafluoroethylene, hydrogen silsesquioxane (HSQ), benzocyclobutene (BCB), parylene, polyimide, etc.

Figure 2B:
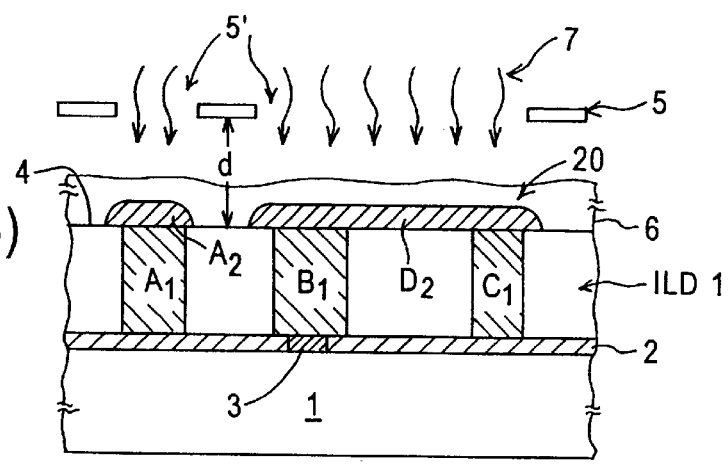

Referring now to FIG. 2(B), in a second step according to the inventive method, substrate 10 is then subjected to a photolytic process for selectively forming a metal layer 20 comprising a predetermined pattern of spaced-apart submicron-dimensioned features (e.g., $A_2$, $D_2$, etc.) in selective vertical registry with the underlying metal features $A_1$, $B_1$, and $C_1$. This step of the inventive process sequence is an improvement over the photolytic processes disclosed in U.S. Pat. Nos. 4,451,503; 4,340,617; and 4,701,347, the entire disclosures of which are incorporated herein by reference, which processes are herein modified (as described below) for particular utility in forming metal patterns having submicron-sized dimensions.

As shown in FIG. 2(B), an exposure mask 5 (e.g., of a metal) containing a predetermined pattern of submicron-dimensioned openings 5' less than about 0.40 μm wide, typically 0.27 μm or less (at present), is positioned at a distance d above the surface 4 of dielectric layer ILD-1. In a departure from the above-cited prior art, a fluid layer 6 comprising a photo-decomposable metal-containing compound is established so as to be limited to the space between surface 4 and the lower surface of mask 5. Preferably, a space remains between the upper surface of the fluid layer 6 and the lower surface of the mask. Collimated electromagnetic radiation 7 of suitable photon energy from a source (not shown in FIG. 2(B)) selectively photolytically decomposes the metal-containing compound contained in the fluid layer at locations exposed by the pattern of mask openings 5'. As a consequence of such photolytic decomposition, a patterned metal layer 20 of submicron-sized dimensions is selectively formed in overlying, ohmic contact with interconnect lines $A_1$, $B_1$, and $C_1$. The intra- and inter—level interconnect patterns which can be formed by the inventive method are highly variable according to the particular mask pattern utilized. Accordingly, the illustrated pattern wherein metal segment $A_2$ contacts only underlying interconnect line $A_1$ whereas metal segment $D_2$ contacts interconnect lines $B_1$ and $C_1$ is but one example demonstrating the extreme versatility and elegant simplicity of the inventive method.

Figure 2C:
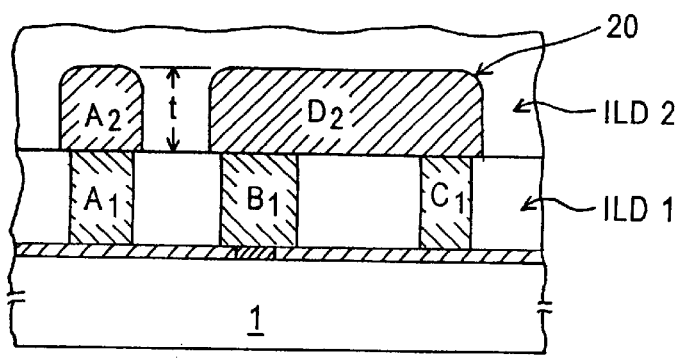
Figure 2D:
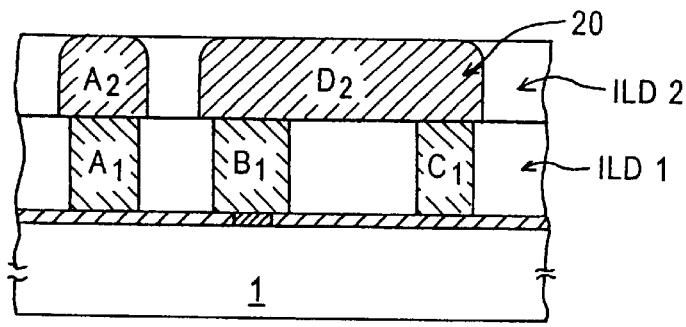

Referring now to FIG. 2(C), the photolytic process of selective patterned deposition as illustrated in FIG. 2(B) is conducted for an interval sufficient for depositing layer 20, illustratively comprising layer segments $A_2$ and $D_2$, to a desired thickness t of from about 4,000 to about 10,000 Å, as determined by any conventional thickness measurement technique or by irradiating for a fixed interval. In a third step according to the inventive method, following completion of patterned metal layer deposition, a second interlayer dielectric (or gap-fill) layer ILD-2 is deposited thereover in blanket form in excess thickness so as to overfill the gaps or spaces between adjacent metal features and subjected to planarization processing, as by conventional techniques, e.g., chemical-mechanical polishing (CMP). The resulting planarized structure having an in-laid metallization or conductor pattern is shown in FIG. 2(D). The planarized structure of FIG. 2(D) may itself then be subjected to a repeat of the inventive 3-step processing sequence to form an additional (i.e., third) metallization pattern overlying and selectively ohmically contacting metal features of the second pattern 20. The process sequence may be repeated as desired, e.g., up to about 15 times, in the manufacture of high-density integration devices according to current design rules and methodology.

Referring now in greater detail to the photolytic process of FIG. 2(B), fluid layer 20 containing a photo-decomposable metal-containing compound may comprise a liquid-containing solution of the compound in a suitable inert liquid solvent (optionally photo-decomposable to yield gaseous products which are drawn off) or a gas comprising a mixture of a gaseous metal-containing compound and an inert gas or a vapor comprising particles of the metal-containing compound entrained in an inert carrier gas. In either instance, according to the instant objective of forming a submicron-dimensioned metallization pattern by use of a correspondingly submicron-dimensioned exposure mask, it is important to limit the presence of the fluid containing the photo-decomposable metal-containing compound to layer 6 intermediate the substrate surface and the bottom of the mask in order to prevent metal deposition thereon. Thus, embodiments of the present invention prevent closing off of the submicron-dimensioned mask apertures which would ultimately result if the fluid were in contact with or otherwise exposed to the upper surface of the exposure mask, as in the above-cited prior art. In order to further reduce or prevent such undesirable metal deposition on the mask surfaces, the thickness of fluid layer 6 is preferably less than spacing d between the substrate upper surface 4 and the lower surface of the mask 5. In this regard, spacing dimension d is not normally critical in view of the use of a source of collimated radiation and is variable within limits, depending upon the required thickness of the fluid layer 20, which itself depends upon several factors determinable by one of ordinary skill in the art for use in a particular application, e.g., absorption coefficient, photolytic reactivity of the metal-containing compound, and its concentration, etc. Thus, in practice, spacing d is largely determined, inter alia, by the design characteristics of the particular optics system utilized, the nature of fluid layer 6, and its requisite thickness. For example, if the fluid layer 20 is liquid, contact between the lower surface of the mask and the liquid surface must be avoided. In such instances, a large spacing d of about 1 meter can be utilized when employing a conventional refractive lens-stepper system. However, the invention can be practiced with a variety of conventional optical systems.

It is also essential for the practice of the inventive method, wherein it is desired to form submicron-dimensioned metal patterns, that the light employed for photolysis be of sufficiently short wavelength as to provide the desired resolution and feature size. Accordingly, short wavelength light in the ultra-violet (UV) and near X-ray portions of the electromagnetic spectrum is necessary for the practice of the inventive method, i.e., below about 250 nm to about 10 nm. The beam of radiation from the source is preferably collimated rather than point focussed or scanned, in order to avoid deleterious effects due to local overheating attendant upon the use of focussed, relatively high energy beams as are contemplated for use herein. Any convenient collimatable source of UV or near X-ray radiation is utilizable for practicing the inventive methodology; the intensity of the collimated beam can be readily correlated with the particular photo-decomposable metal-compound (i.e., its concentration, absorption coefficient, photolytic reactivity, desired metal layer thickness) by one of ordinary skill in the art for use in a particular application and by recourse to the patents incorporated herein by reference. In addition, the irradiation may be continuous until a desired thickness is achieved, or pulsed, with replenishment of the fluid layer 6 with fresh fluid between consecutive pulses.

A variety of metals such as are conventionally employed for forming "back-end" contacts and metallization patterns of integrated circuit semiconductor devices are utilizable the present invention, including, inter alia, titanium, tantalum, tungsten, molybdenum, aluminum, chromium, nickel, cobalt, palladium, silver, gold, copper, and alloys thereof, with copper being preferred.

Photolytically decomposable compounds of the enumerated metals are conventionally known and readily available, and include, by way of illustration but not limitation, metal alkyls of general formula $M(C_nH_{2n+1})_m$; metal carbonyls of general formula $M(CO)_n$; metal alkoxides of general formula $M(OC_nH_{2n+1})_m$; metal alkanoates of general formula $M(OOCR)_n$; metal alkyl hydrides of general formula $(C_nH_{2n+1})_mMH$; and metal halides (X=F or Cl), azides, and nitrites. Normally gaseous compounds may be supplied to the substrate surface in the flow of an admixed inert gas (e.g., argon, nitrogen, etc.), while normally liquid compounds may be entrained in a flow of inert gas by bubbling therethrough, as is conventional in chemical vapor deposition (CVD). Alternatively, normally liquid or solid compounds may be dissolved, dispersed, or suspended in a suitable solvent (e.g., a hydrocarbon) which yields gaseous products upon photolytic decomposition.

Another class of photo-decomposable metal-containing compounds which can be supplied in layer form to the substrate surface as a liquid solution, suspension, or dispersion, are metal chelates, e.g., metal complexes wherein a metal atom or ion (typically a transition metal such as those enumerated above) is bound to a multi-dentate, typically organic-based chelating agent, e.g., ethylene diamine tetra-acetic acid (EDTA) and nitrilo-triacetic acid (NTA), etc. Upon irradiation with relatively high energy UV or near X-ray radiation according to the inventive method, the bonds between the atoms of the organic chelating agent and with the chelated metal atom or ion are ruptured, resulting in deposition of the metal on the substrate surface.

Figure 1:
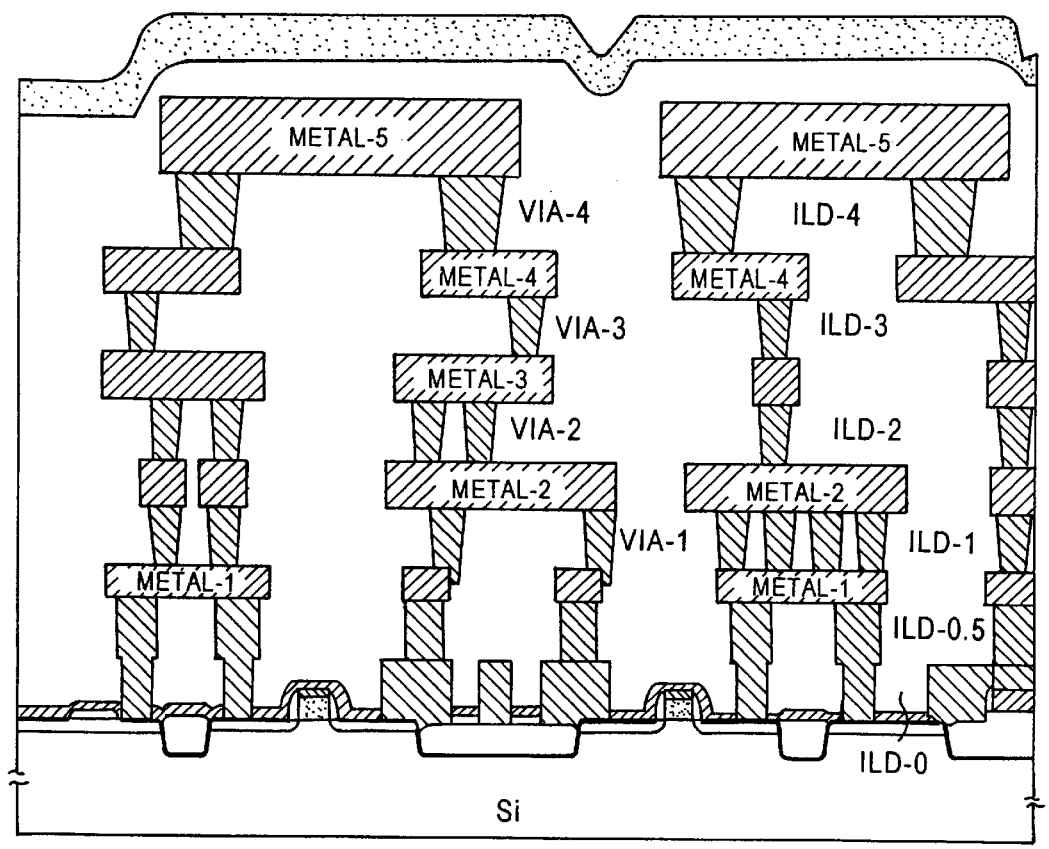
FIG. 1 illustrates, in simplified, cross-sectional schematic form, a portion of a multi-metallization layer "back-end" contact/interconnect structure of an integrated circuit semiconductor device.

Referring now to FIG. 3, shown therein in schematic, cross-sectional form, is an illustrative, but non-limitative example of an in-line apparatus 30 suitable for performing photolytic metal pattern deposition according to an embodiment of the present invention, which apparatus is an improvement of that shown in FIG. 1 of U.S. Pat. No. 4,451,503.

Apparatus 30, when adapted for use as part of a continuous manufacturing line such as is conventional in semiconductor manufacture, comprises a photolysis chamber 30' having entrance and exit apertures 31 and 32, respectively, at opposite sides thereof for receiving and discharging semiconductor wafer substrates 1 supplied thereto and removed therefrom by a transport mechanism 33 of conventional design. Central area 34 of the chamber bottom wall includes means (not shown for illustrative simplicity) for accommodating and fixedly mounting wafer substrate 1 during photolytic metal deposition processing. Continuous or pulsed radiation source 35 is positioned above the photolysis chamber 30' for providing a collimated beam 36 of UV to near X-ray radiation of wavelengths in the range from below about 250 nm to about 10 nm for passage through fused silica window 37 at the upper end of the chamber and through the predetermined pattern of submicron-dimensioned openings 5' formed in exposure mask 5. Photolysis fluid for establishing a fluid layer 6 over the upper surface 4 of wafer 1 is supplied in gaseous or liquid form from reservoir 38 (or similar storage means) directly to an edge of wafer 1 via supply conduit 39, uniformly spread over the wafer surface (by means not shown in the drawing for illustrative simplicity), and removed thereform via withdrawal conduit 40 positioned at an opposite wafer edge. The arrangement as described above effectively prevents or at least minimizes contact of the mask 5 surfaces with photolysis fluid, thereby substantially reducing or eliminating closing off of the submicron-dimensioned mask apertures during photolysis treatment.

The present invention enables rapid formation of reliable, defect-free, in-laid, multi-level "back-end" contacts and interconnections by providing a simplified process which dramatically reduces the heretofore required number of processing steps, relative to conventional methodology for forming high-density integration semiconductor devices. The inventive process also effects a substantial increase in production throughput by reducing the time and cost of patterned metal layer deposition vis-à-vis conventional methodology employing photolithographic masking and etching techniques.

The present invention is applicable to the formation of various types of submicron-dimensioned metallization patterns, including, but not limited to, high aspect ratio in-laid metallization patterns employed in "back-end" processing of integrated circuit semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present, invention is capable of use in various other combinations and environments and is susceptible to changes or modifications within the scope of the inventive concept as expressed herein.

What is claimed is:

1. A method of forming a patterned metal layer on a surface of a substrate, said metal pattern including a plurality of spaced-apart, submicron-dimensioned features, which method comprises the sequential steps of:

(a) providing a substrate having a surface for receiving said metal pattern thereon;

(b) positioning a patterned exposure mask such that a lower surface thereof faces said substrate surface at a predetermined distance above said substrate surface, said mask comprising a predetermined pattern of submicron-dimensioned openings formed therethrough for defining said metal pattern;

(c) supplying a fluid limited to and which partially occupies the space between said lower surface of said mask and said substrate surface, such that a layer of said fluid is established which contacts said substrate surface but does not contact said lower surface of said mask, said fluid comprising a compound containing at least one atom of a metal;

(d) selectively irradiating the portions of said fluid layer exposed through said pattern of mask openings with pulsed collimated radiation of a wavelength in the ultraviolet (UV) to the near X-ray portions of the electromagnetic spectrum to thereby photo-decompose said metal-containing compound and selectively deposit said patterned metal layer at locations corresponding to said predetermined pattern of mask openings;

(e) replenishing, said fluid layer with fresh fluid, said replenishing occurring only during intervals between consecutive radiation pulses when said substrate and said fluid layer are not irradiated; and (f) continuing said irradiating for an interval sufficient to form said patterned metal layer to a predetermined thickness.

2. The method according to claim 1, wherein said fluid layer comprises a liquid solution of said metal-compound in a solvent or a gas comprising said metal-containing compound and an inert carrier gas.

3. The method according to claim 1, wherein said metal-containing compound is a metal halide, an organometallic compound, or a metal chelate.

4. The method according to claim 3, wherein the metal of said metal-containing compound is selected from the group consisting of titanium, tantalum, tungsten, molybdenum, aluminum, chromium, nickel, cobalt, palladium, silver, gold, and copper.

5. The method according to claim 4, wherein said metal is copper.

6. The method according to claim 5, wherein said copper-containing compound is selected from the group consisting of alkyls, alkyl hydrides, alkoxides, alkanoates, halides, azides, nitrites, and chelates of copper.

7. The method according to claim 1, wherein step (a) comprises providing a semiconductor wafer having said surface, said wafer including at least one active device region or component formed in, on, or below said wafer surface, a layer of a dielectric material formed over said wafer surface and having a surface including a first in-laid metal pattern, said first in-laid metal pattern comprising a plurality of spaced-apart, submicron-dimensioned features; and step (b) comprises positioning said first patterned exposure mask in a predetermined vertically registered relation with said in-laid metal pattern, whereby predetermined portions of said features of said patterned metal layer are formed in overlying contact with predetermined portions of said features of said first in-laid metal pattern.

8. The method according to claim 7, further comprising:
(g) depositing a layer of a dielectric material filling the gaps or spaces between adjacent features of said patterned metal layer formed in step (f), said dielectric material layer being blanket-deposited in an excess thickness over said patterned metal layer.

9. The method according to claim 8, further comprising:
(h) removing said excess thickness of said dielectric material layer and planarizing the surface thereof to form a second in-laid metal pattern overlying said first in-laid metal pattern.

10. The method according to claim 9, further comprising repeating steps (b)–(h) n times, where n is an integer from 1 to 15.

11. A method of manufacturing a semiconductor device, which method comprises the sequential steps of:
(a) providing a substrate comprising a semiconductor wafer, said wafer including a surface having a dielectric layer formed thereover, the surface of said dielectric layer comprising a first pattern of spaced-apart, submicron-dimensioned metal features forming electrical contacts, vias, interlevel metallization, and interconnect routing of at least one active device region or component of said semiconductor wafer substrate;
(b) positioning a patterned exposure mask such that a lower surface thereof faces said substrate surface at a predetermined distance above said substrate surface, said mask comprising a predetermined pattern of submicron-dimensioned openings formed therethrough, said mask being positioned in a predetermined vertically registered relation with said first in-laid metal pattern;
(c) supplying a fluid limited to and which partially occupies the space between said lower surface of said mask and said substrate, such that a layer of said fluid is established which contacts said substrate surface but does not contact said lower surface of said mask, said fluid comprising a compound containing at least one atom of a metal;
(d) selectively irradiating the portions of said fluid layer exposed through said pattern of mask openings with pulsed collimated radiation of wavelengths in the ultraviolet (UV) to the near X-ray portions of the electromagnetic spectrum to thereby photo-decompose said metal-containing compound and selectively deposit a patterned layer of said metal at locations corresponding to said predetermined pattern of mask openings, whereby predetermined portions of said patterned metal layer are formed in overlying contact with predetermined portions of said features of said first in-laid metal pattern;
(e) replenishing said fluid layer with fresh fluid, said replenishing occurring only during intervals between consecutive radiation pulses when said substrate and said fluid layer are not irradiated; and
(f) continuing said irradiating for an interval sufficient to form said patterned metal layer to a predetermined thickness.

12. The method according to claim 11, further comprising:
(g) depositing a layer of a dielectric material filling the gaps or spaces between adjacent features of said patterned metal layer formed in step (f), said dielectric material layer being blanket-deposited in an excess thickness over said patterned metal layer.

13. The method according to claim 12, further comprising:
(h) removing said excess thickness of said dielectric material layer and planarizing the surface thereof to form a second in-laid metal pattern overlying said first in-laid metal pattern.

14. The method according to claim 13, further comprising repeating steps (b)–(h) n times, where n is an integer from 1 to 15.

15. The method according to claim 14, wherein said metal-containing compound is a metal halide, azide, or nitrite, an organometallic compound, or a metal chelate and the metal of said metal-containing compound is selected from the group consisting of titanium, tantalum, tungsten, molybdenum, aluminum, chromium, nickel, cobalt, palladium, silver, gold, and copper.

16. The method according to claim 15, wherein said metal is copper.

* * * * *